US010619798B2

(12) United States Patent
Huang

(10) Patent No.: US 10,619,798 B2
(45) Date of Patent: Apr. 14, 2020

(54) LED LAMP WITH HEAT DISSIPATION EFFECT

(71) Applicant: Liquidleds Lighting Corp., Taipei (TW)

(72) Inventor: David Huang, Taipei (TW)

(73) Assignee: LIQUIDLEDS LIGHTING CORP., Taipei (TW)

( * ) Notice: Subject to any disclaimer, the term of this patent is extended or adjusted under 35 U.S.C. 154(b) by 0 days.

(21) Appl. No.: 15/935,547

(22) Filed: Mar. 26, 2018

(65) Prior Publication Data

US 2018/0283674 A1 Oct. 4, 2018

Related U.S. Application Data

(60) Provisional application No. 62/479,327, filed on Mar. 31, 2017.

(51) Int. Cl.

| F21V 29/56 | (2015.01) |
|---|---|
| F21S 4/28 | (2016.01) |
| H01L 33/62 | (2010.01) |
| H01L 25/075 | (2006.01) |
| H01L 33/52 | (2010.01) |
| F21V 3/02 | (2006.01) |

(Continued)

(52) U.S. Cl.
CPC .............. *F21K 9/232* (2016.08); *F21K 9/235* (2016.08); *F21S 4/28* (2016.01); *F21S 10/002* (2013.01); *F21V 3/02* (2013.01); *F21V 19/001* (2013.01); *F21V 29/506* (2015.01); *F21V 29/56* (2015.01); *F21V 29/71* (2015.01); *F21V 31/005* (2013.01); *H01L 25/0753* (2013.01); *H01L 33/483* (2013.01); *H01L 33/52* (2013.01); *H01L 33/54* (2013.01); *H01L 33/62* (2013.01); *F21V 9/00* (2013.01); *F21Y 2103/10* (2016.08); *F21Y 2115/10* (2016.08)

(58) Field of Classification Search
CPC ........... F21S 10/002; F21S 4/28; F21V 29/56; F21V 29/71; F21V 9/00
See application file for complete search history.

(56) References Cited

U.S. PATENT DOCUMENTS

| 7,997,750 B2 | 8/2011 | Chiang |
| 8,115,370 B2 | 2/2012 | Huang |

(Continued)

FOREIGN PATENT DOCUMENTS

| CN | 102644879 A | 8/2012 |
| CN | 205640356 U | 7/2016 |

(Continued)

*Primary Examiner* — Thomas A Hollweg
*Assistant Examiner* — Jacob R Stern
(74) *Attorney, Agent, or Firm* — Alan D. Kamrath; Karin L. Williams; Mayer & Williams PC

(57) ABSTRACT

An LED lamp with a heat dissipation effect has an LED device and a lamp base. The LED device has a light bar and a protective cover. The light bar is formed by LED chips arranged on a plurality of conductive substrates at intervals and a packaging layer covering the LED chips. The protective cover covers the light bar and is filled with cooling liquid inside. The cooling liquid is in contact with the light bar for cooling. The heat generated by the LED chips is conducted to the protective cover by the cooling liquid, and then distributed to the air, thereby improving heat dissipation.

14 Claims, 23 Drawing Sheets

(51) Int. Cl.
*F21K 9/232* (2016.01)
*F21V 29/71* (2015.01)
*F21K 9/235* (2016.01)
*F21S 10/00* (2006.01)
*F21V 31/00* (2006.01)
*F21V 29/506* (2015.01)
*F21V 19/00* (2006.01)
*H01L 33/48* (2010.01)
*H01L 33/54* (2010.01)
*F21Y 115/10* (2016.01)
*F21Y 103/10* (2016.01)
*F21V 9/00* (2018.01)

(56) References Cited

U.S. PATENT DOCUMENTS

| | | | | |
|---|---|---|---|---|
| 8,454,185 | B2* | 6/2013 | Hua | F21S 6/005 313/46 |
| 9,825,012 | B2 | 11/2017 | Hsieh | |
| 9,945,532 | B2 | 4/2018 | Huang | |
| 10,083,945 | B2 | 9/2018 | Hsieh | |
| 10,319,703 | B2 | 6/2019 | Hsieh | |
| 2011/0050073 | A1 | 3/2011 | Huang | |
| 2011/0163683 | A1* | 7/2011 | Steele | F21V 23/02 315/192 |
| 2011/0255268 | A1 | 10/2011 | Horn et al. | |
| 2012/0020089 | A1 | 1/2012 | Hsieh et al. | |
| 2012/0162965 | A1 | 6/2012 | Takeuchi et al. | |
| 2012/0194071 | A1 | 8/2012 | Huang | |
| 2014/0015397 | A1 | 1/2014 | Chen | |
| 2015/0069442 | A1 | 3/2015 | Liu et al. | |
| 2018/0112831 | A1 | 4/2018 | Huang | |

FOREIGN PATENT DOCUMENTS

| | | |
|---|---|---|
| CN | 205806997 U | 12/2016 |
| JP | 2015038853 A | 2/2015 |
| TW | 201430274 A | 8/2014 |

* cited by examiner

US 10,619,798 B2

LED LAMP WITH HEAT DISSIPATION EFFECT

BACKGROUND OF THE INVENTION

1. Field of the Invention

The present invention relates to lighting fixtures and, more particularly, to an LED lamp with a heat dissipation effect.

2. Description of the Prior Arts

U.S. Pat. No. 7,997,750 B2 discloses a high power LED bulb which has a high-power LED element in a center of the bulb. The LED element is surrounded by a cooling assembly, and the cooling assembly can be made of metal. Although the interior of the bulb is filled with liquid, heat must be passed from the LED element to the heat sink, then to the liquid, and finally to the air through a housing of the LED bulb. Because the interior of the housing is a large cavity and the LED element as a heat source is far from the housing, the heat transfer path is extremely long and unfavorable to quickly dissipate heat. Furthermore, if the cavity is filled with liquid, the weight and the volume of the LED bulb will be significantly increased.

In addition, U.S. Patent Publications US2011/0255268A1 and US2014/0015397A1 also disclose an LED bulb having LEDs disposed on a cooling base, and the cooling base is made of metal and is located in an inner center of a bulb housing. The two patent publications also have the same problems of the patent mentioned above.

U.S. Pat. No. 8,115,370 B2 discloses an LED tube lamp. A plurality of LED chips is disposed on an elongated flexible circuit board, and then placed in a glass tube. The bent glass tube can be filled with cooling liquid. As the LED chip used in the patent emits unidirectional light and is far away from the adjacent LED chips, the LED tube lamp is unable to provide a continuous lighting effect. Because the flexible circuit board is wide, the glass tube needs to be relatively large in diameter to hold the flexible circuit board therein. However, limited by the material, the glass tube is fragile and unfavorable to be made into a specific shape as desired. If the cooling liquid is injected into the glass tube, the glass tube will be easily broken from the anchor point by the increased weight.

To overcome the shortcomings, the present invention provides an LED lamp with a heat dissipation effect to mitigate or obviate the aforementioned problems.

SUMMARY OF THE INVENTION

To overcome the problems that the conventional LED bulbs have increased weight resulted from additional metal cooling elements and have a relative long heat conduction path, the present invention provides an LED lamp having a liquid cooling medium with features of small size, light weight and fast heat dissipation.

To achieve the foregoing objective, the LED lamp with a heat dissipation effect comprises:

a light bar having multiple conductive substrates and multiple LED chips arranged on the conductive substrates, with each LED chip being a double-sided light-emitting flip chip that is hosted and electrically connected by two adjacent said conductive substrates, with an upper surface and a lower surface of each of the LED chips respectively covered with a packaging layer, and with the light bar having at least one wire connected to the conductive substrates;

a protective cover comprising an insulative light-transmitting tube, with the light-transmitting tube being a plastic tube made by extrusion molding and covering the light bar;

cooling liquid being translucent and insulating, with the cooling liquid filled into the protective cover and contacting the light bar;

sealing elements disposed in the protective cover to prevent the cooling liquid from leaking out, with each of the at least one wire of the light bar passing through a respective one of the sealing elements;

a fixing block, with the end of the light bar covered with the protective cover and filled with the cooling liquid being fixed to the fixing block, with a circuit board disposed inside the fixing block, and with the circuit board electrically connected to the at least one wire of the light bar; and a lamp base mounted to the fixing block and electrically connected to the circuit board, with the lamp base adapted to connect to an external power source.

In the present invention, the cooling liquid is injected into the protective cover and directly contacts the light bar, and the heat energy generated by the light bar can be transferred to the protective tube and then to the air outside the protective cover. As the distance between the light bar and the protective tube is very short, the heat energy can be quickly transferred by the cooling liquid, thereby enhancing the heat dissipation efficiency. Furthermore, the invention does not require extra metal cooling elements, so the weight of the LED lamp can be reduced.

In the present invention, the protective cover has a curved shape with a long length. If there is any significant temperature difference among different sections of the protective cover, natural convection may occur in the cooling liquid due to the temperature difference to uniformly dissipate heat.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
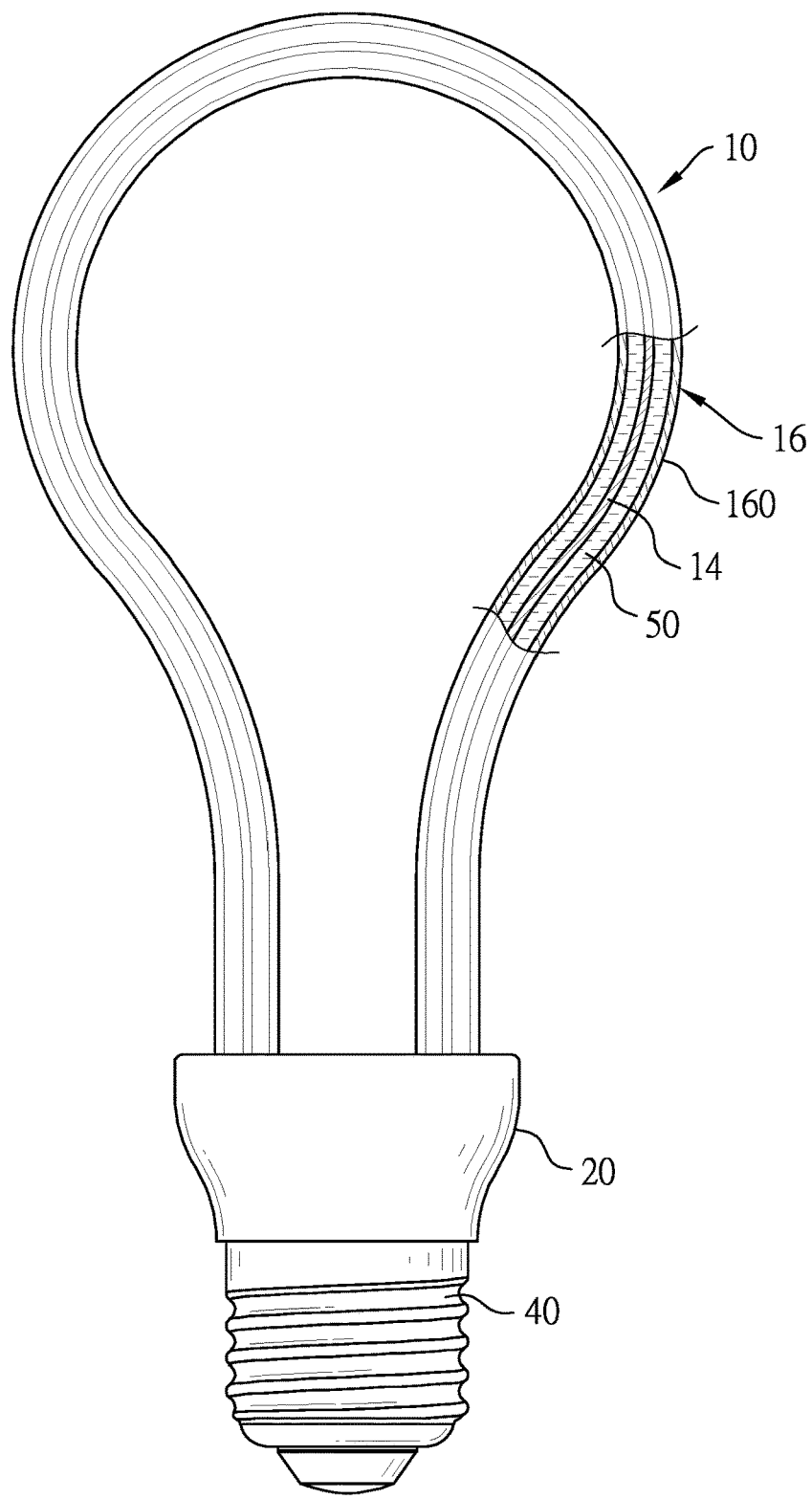
FIG. 1 is a schematic view of the present invention.
Figure 2:
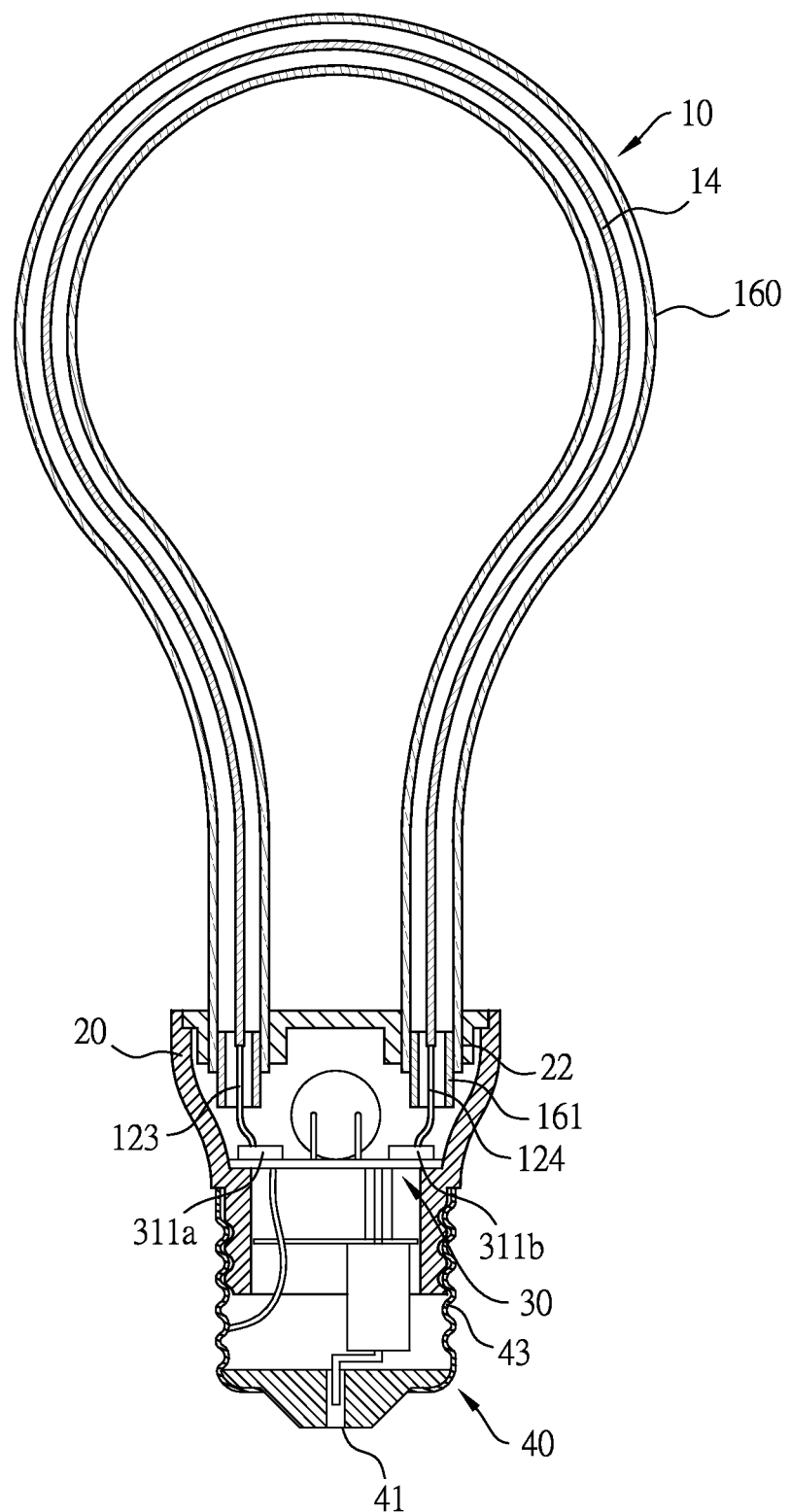
FIG. 2 is an exploded view of the present invention.

Referring to FIG. 1 and FIG. 2, an LED lamp with a heat dissipation effect comprises an LED device 10, a fixing block 20, a circuit board 30, and a lamp base 40.

Figure 3:
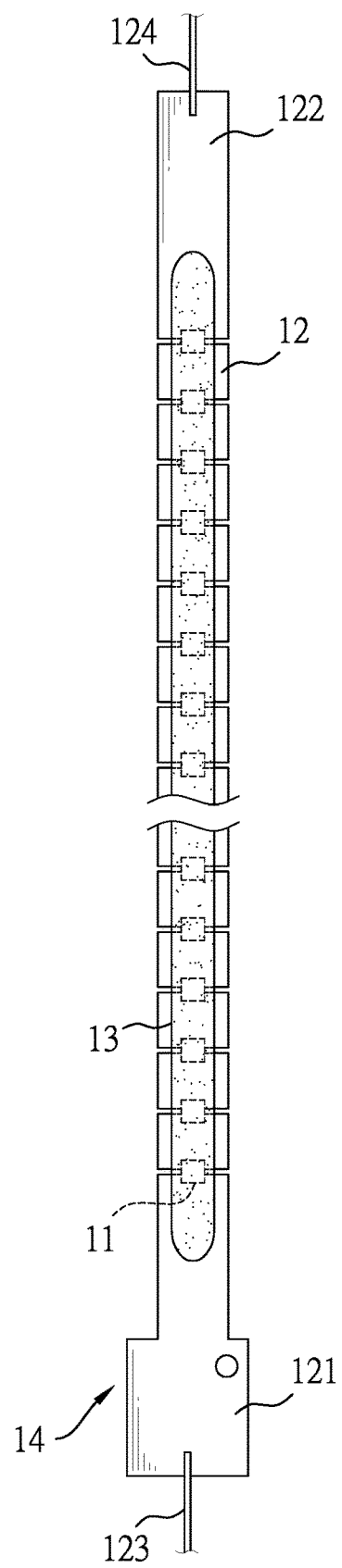
FIG. 3 is a schematic view of the light bar in accordance with the present invention.
Figure 4:
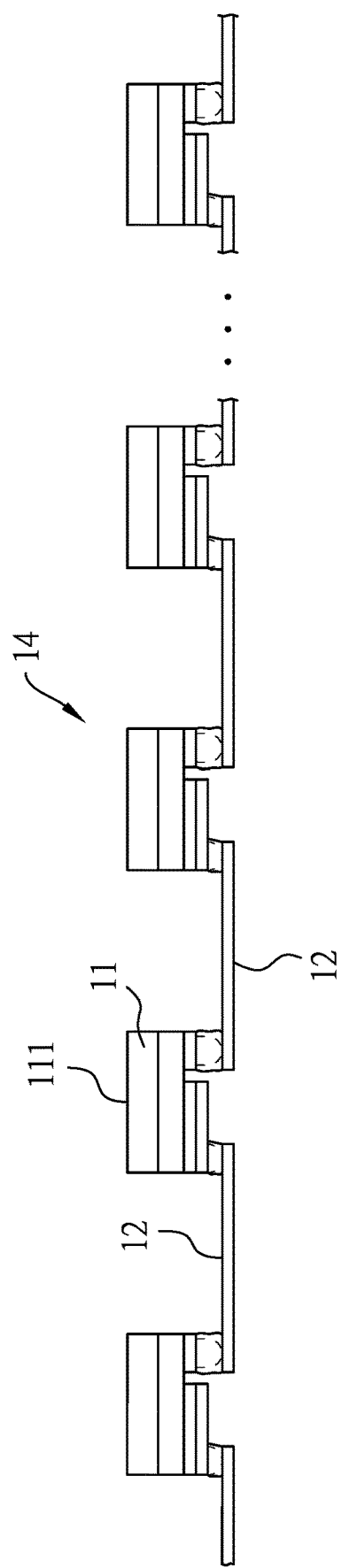
FIG. 4 is a side view of the light bar in accordance with the present invention.

The LED device 10 comprises a light bar 14 and a protective cover 16. As shown in FIG. 3 and FIG. 4, the light bar 14 has multiple light emitting diode chips 11 (LED chips), multiple conductive substrates 12 and a packaging layer 13. Each LED chip 11 may be a double-sided light-emitting LED with a flip chip structure, or may have at least one top light-emitting surface 111. Each LED chip 11 can emit light from the top light-emitting surface 111 outwardly, and the top light-emitting surface 111 is at the top of the LED chip 11. Each of the conductive substrates 12 is a metal conductive sheet. The conductive substrates 12 are arranged in a sequence with an interval between each two adjacent conductive substrates 12. Each of the LED chips 11 is mounted between two adjacent conductive substrates 12 and electrically connected to the two adjacent conductive substrates 12. The packaging layer 13 includes at least one upper packaging layer 131 for covering one surface of the conductive substrates 12 and the LED chip 11 on the surface to form the light bar 14. In the present embodiment, the light bar 14 has flexibility. In the embodiment, referring to FIG. 3, a first conductive portion 121 is formed on and extends from the conductive substrate 12 at one end of the light bar 14, and a second conductive portion 122 is formed on and extends from the conductive substrate 12 at the other end of the light bar 14. The first conductive portion 121 and the second conductive portion 122 are two opposite electrodes. The first conductive portion 121 and the second conductive portion 122 can be each connected to a respective wire 123, 124 for receiving power. The light bar 14 of the present invention is not limited to be provided with two wires 123, 124. In other embodiments, the light bar 14 can be provided with a single wire as long as a power circuit can be formed. The conductive substrate 12 of the present invention is different from a conventional flexible PCB in that the width of the conductive substrate 12 is relatively narrow and can be between 2 mm and 6 mm, to reduce the effect of double-sided light emission when the width of the substrate is too large. In contrast, as the conductive substrate 12 of the present invention is narrow, a slim and comprehensive glow visual effect can be achieved when the LED chip 11 is lit.

Figure 5:
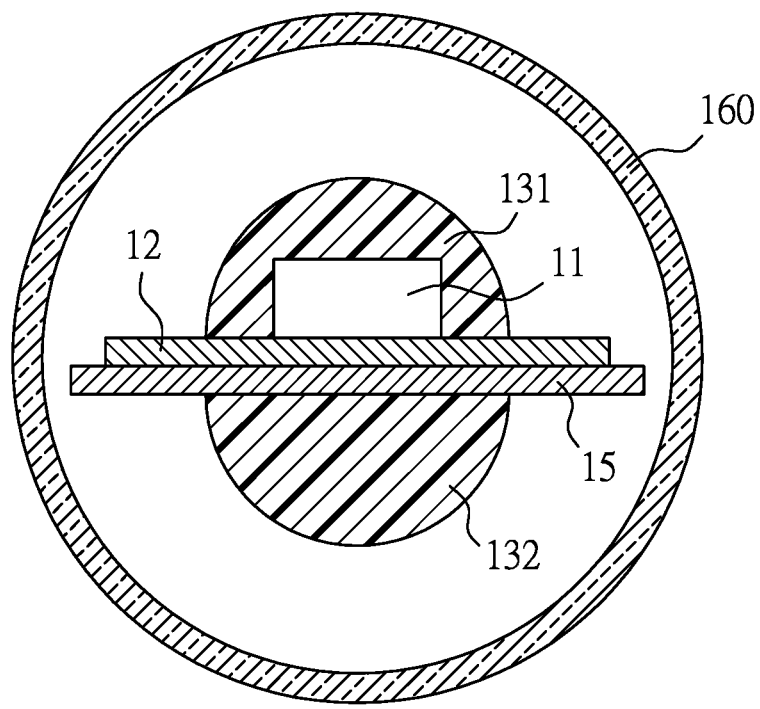
FIG. 5 is a sectional view of the LED device in accordance with the present invention.

Referring to FIG. 5, in the present embodiment, the packaging layer 13 includes an upper packaging layer 131 and a lower packaging layer 132. A maximum width of the packaging layer 13 is denoted as W2. A light-transmitting plate 15 is disposed on the lower surface of each conductive substrate 12 so that the light can be transmitted downward through the light-transmitting plate 15. The area of the light-transmitting plate 15 is greater than or equal to the area of each conductive substrate 12. The upper packaging layer 131, having a substantially semi-elliptical cross section, is disposed on the upper surface of the conductive substrate 12 and completely covers the plurality of LED chips 11. The lower packaging layer 132, having a substantially semi-elliptical cross section, covers the lower surfaces of the conductive substrate 12 and the LED chips 11.

In this embodiment, the protective cover 16 is a light-transmitting tube 160, and the light-transmitting tube 160 can be formed into different shapes. The light-transmitting tube 160 is a light-transmitting insulator for protecting the light bar 14 and allowing light to be transmitted. The light-transmitting tube 160 can be manufactured by extrusion molding, heating to soften the tube, and then putting the tube into a mold. Therefore, the light-transmitting tube 160 is made of a non-glass plastic material. An outer diameter D1 of the protective cover is in a range from 4 mm to 16 mm. An inner diameter D2 of the protective cover is in a range from 3 mm to 15 mm. The ratio of the maximum width W2 of the packaging layer 13 to the inner diameter D2 of the protective cover 16 is greater than 0.3 and less than 1, i.e. $0.3 < W2/D2 < 1$.

The protective cover 16 is filled with cooling liquid 50. The cooling liquid 50 is light-transmitting, insulating and non-self-igniting, and may be silicon oil, for example. In one embodiment, a pigment or reflective particles can be added or dispensed in the cooling liquid to change color of the cooling liquid or enhance the visual effect. After the cooling liquid 50 is injected into the interior of the protective cover 16, sealing elements 161 are disposed into openings of two ends of the protective cover 16. The sealing elements 161 may be an annular block or a hollow sleeve. A through hole may be formed on each sealing element 161. The wires 123, 124 at both ends of the light bar 14 can be connected to the circuit board 30 through the through holes of the sealing elements 161. In an embodiment, after the wires 123, 124 pass through the sealing elements 161, an adhesive is coated into the through holes of the sealing elements 161 to seal both ends of the protective cover 16 after the adhesive is hardened. Then, the cooling liquid 50 can avoid leaking out. In another embodiment, the sealing elements 161 are the adhesive, and after the wires pass through the adhesive and the adhesive is hardened, the sealing elements 161 seal both ends of the protective cover 16.

Referring to FIG. 1, multiple holes 22 are formed in the fixing block 20. In the present embodiment, the fixing block 20 has two holes 22. Each hole 22 has a diameter matching an outer diameter of the protection cover 16. Two opposite ends of the protective cover 16 are respectively fixed in the two holes 22. A mounting distance L2 is the maximum distance measured between the outer surfaces of the two opposite ends of the protective cover 16 alone a horizontal direction X. The first conductive portion 121 and the second conductive portion 122 at both ends of the LED device 10 are respectively inserted into the two holes 22 and fixed in the holes 22 to keep the LED device 10 fixed in position. An expansion distance L1 is the maximum distance measured from two opposite points on the protective cover 16 alone the same horizontal direction X. The expansion distance L1 is greater than the mounting distance L2, i.e. $L1 > L2$.

The circuit board 30 is disposed inside the fixing block 20 and is provided with a plurality of electrode terminals. In this embodiment, two electrode terminals 311a, 311b are formed on the circuit board 30 and have opposite polarities, for example, a positive electrode terminal and a negative electrode terminal. The positive electrode terminal is electrically connected to the first conductive portion 121, while the negative electrode terminal is electrically connected to the second conductive portion 122. A control circuit is formed on the circuit board 30 by electronic components, such as capacitors, resistors IC and so on.

The lamp base 40 has a first electrical connection portion 41 therein and a second electrical connection portion 43 at a side thereof. The first electrical connection portion 41 and the second electrical connection portion 43 are for connecting to opposite polarities of an external power source. The first electrical connection portion 41 and the second electrical connection portion 43 are respectively electrically connected to the electrode terminals 311a, 311b of the circuit board 30. In the present embodiment, the second electrical connection portion 43 is a threaded structure.

In the present invention, the cooling liquid 50 is injected into the protective cover 16 and directly contacts the light bar 14, so the heat energy generated by the LED chip 11 can be transferred to the cooling liquid 50, and then to the protective cover. 16, and finally directly dissipated in the air, thereby achieving a good heat dissipation. The invention does not need extra metal cooling elements, so the lamp weight can be reduced.

Figure 7A:
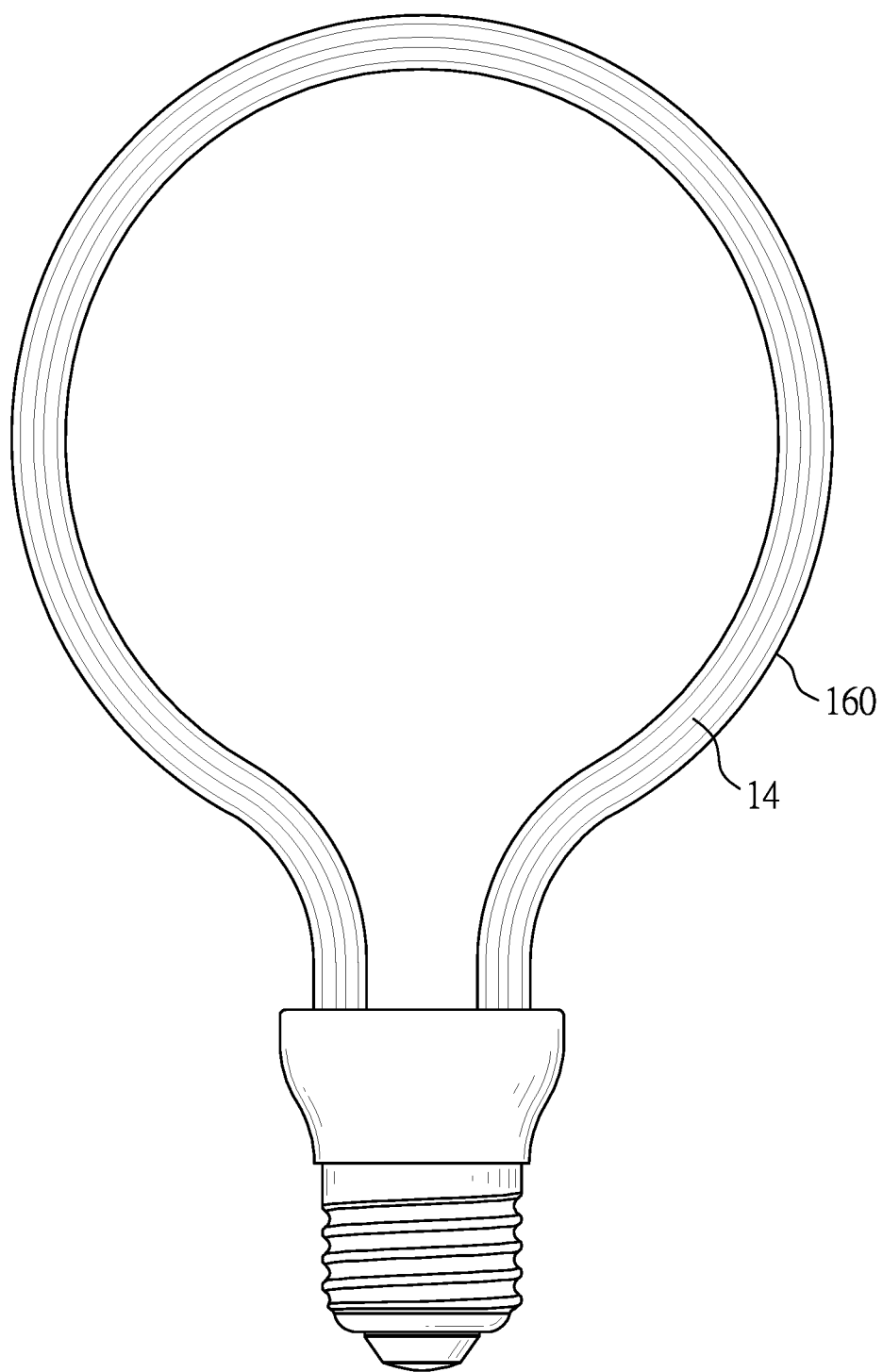
FIGS. 7A~7I are different embodiments of the present invention.
Figure 7B:
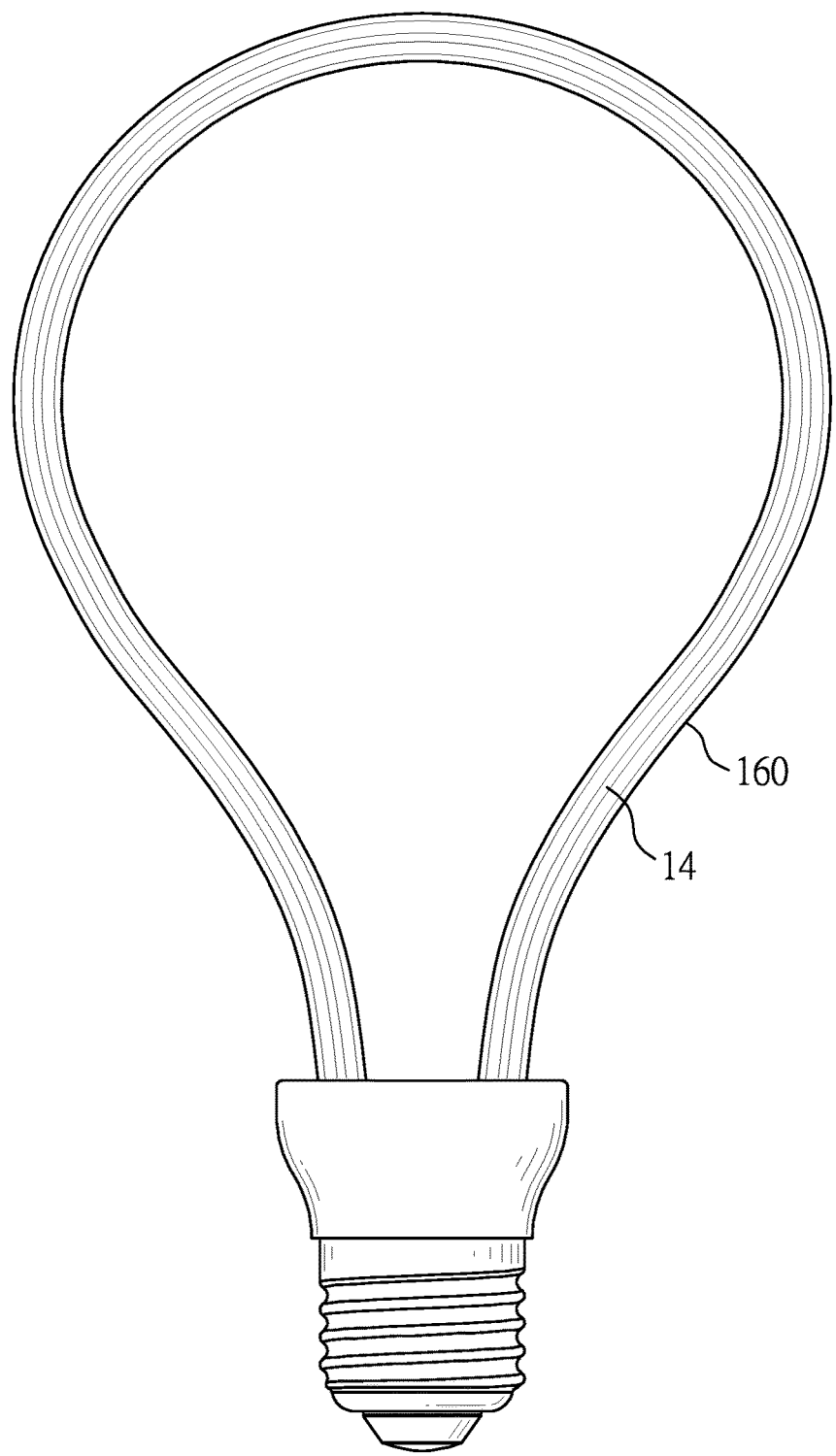
Figure 7C:
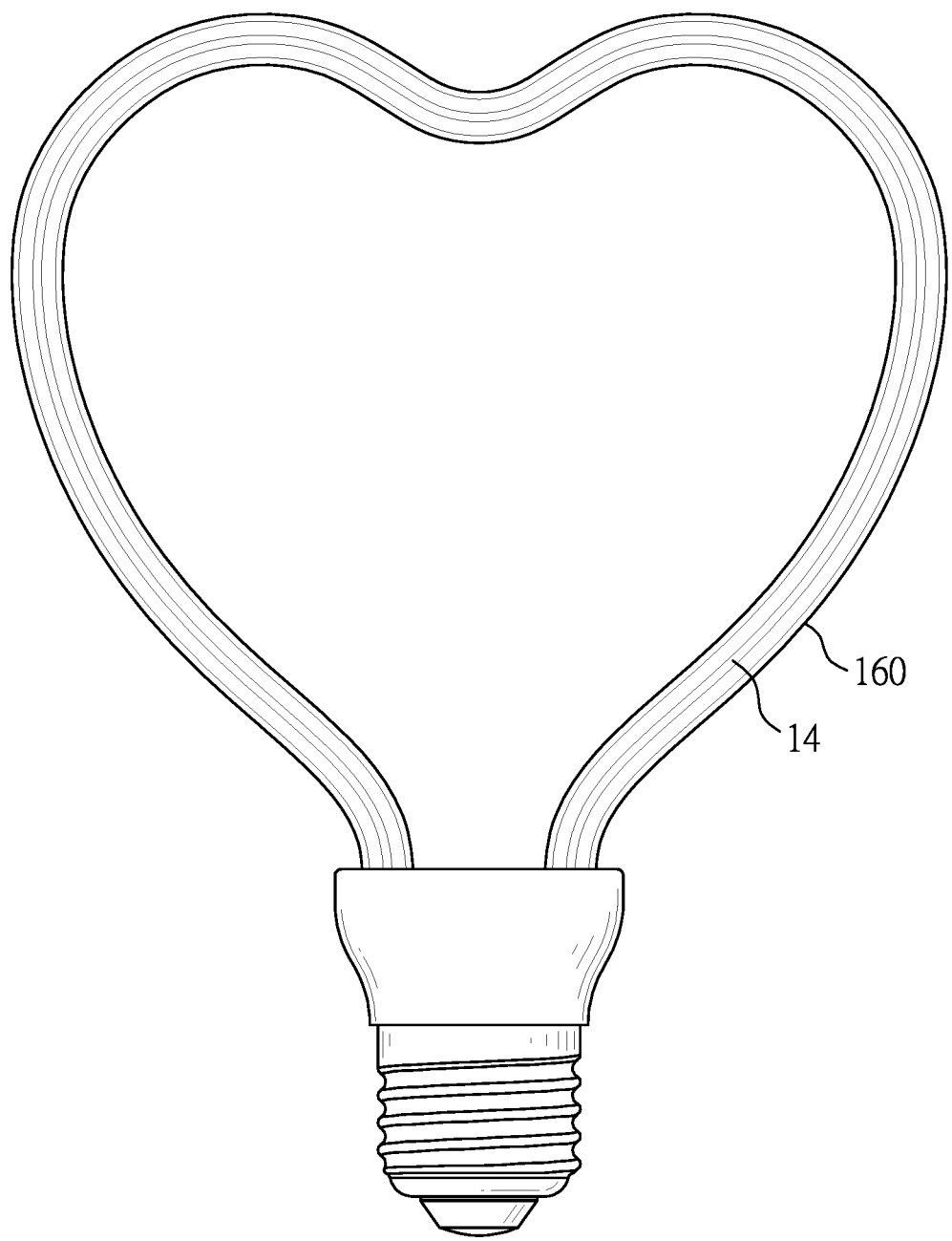
Figure 7D:
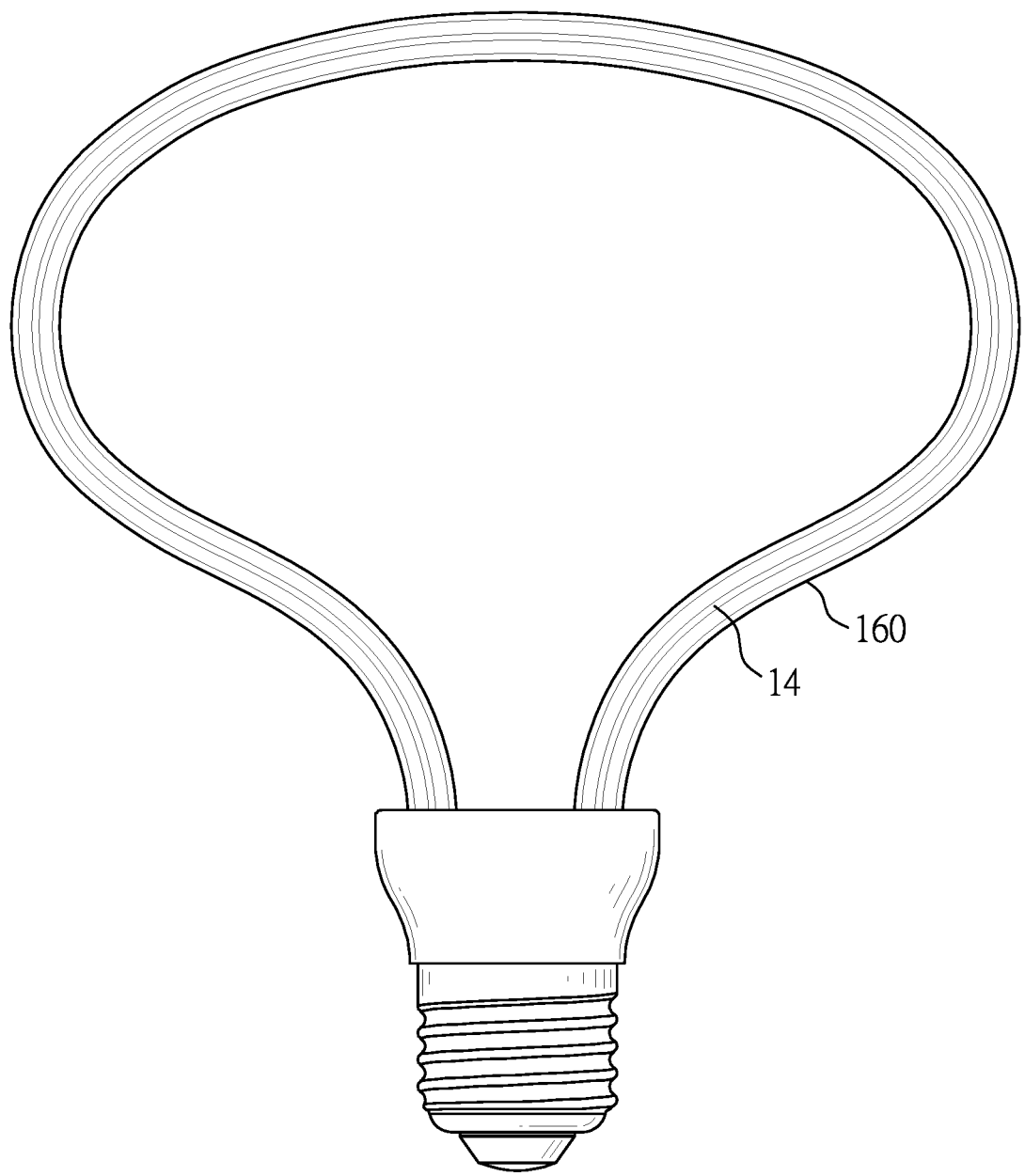
Figure 7E:
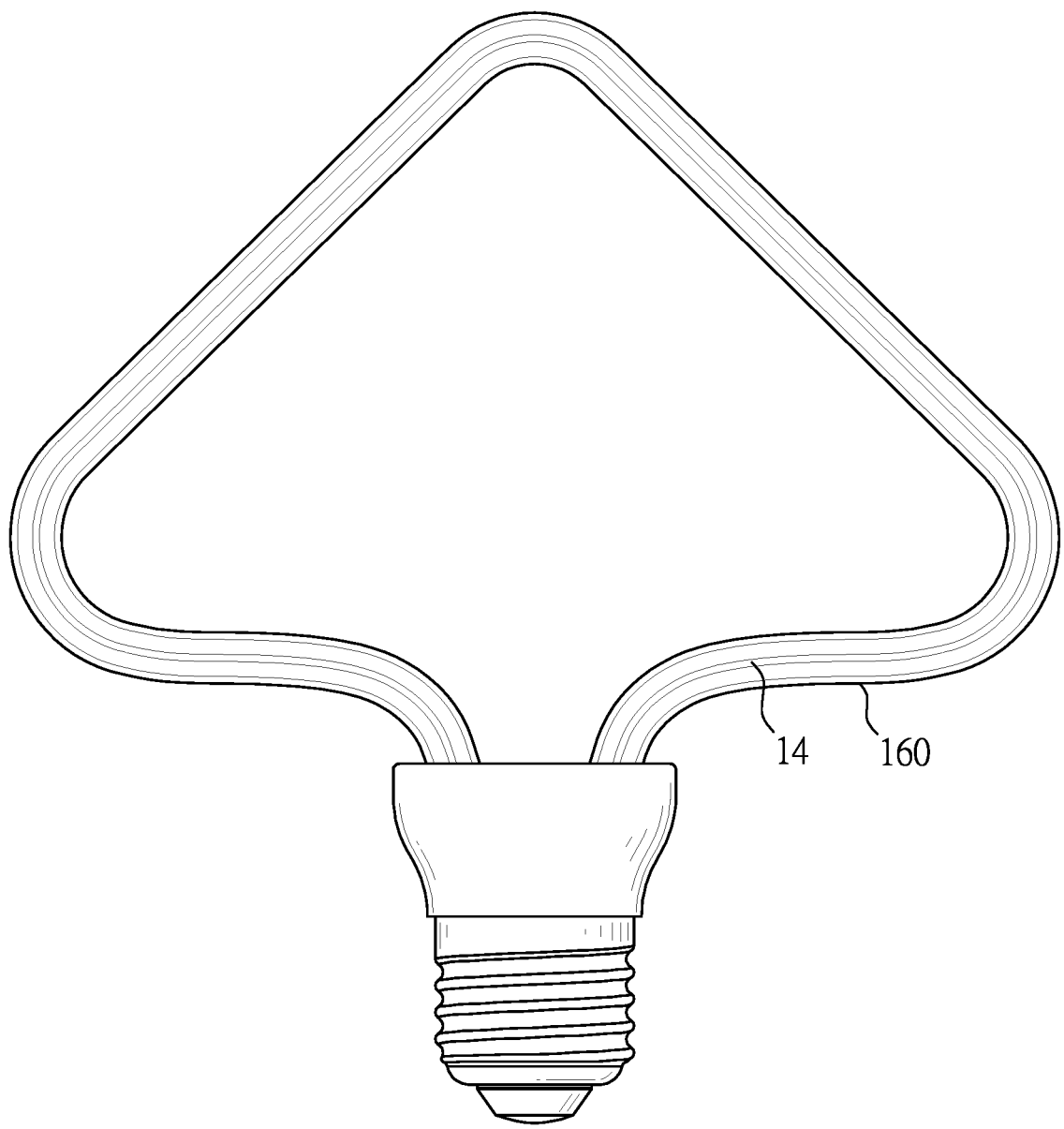
Figure 7F:
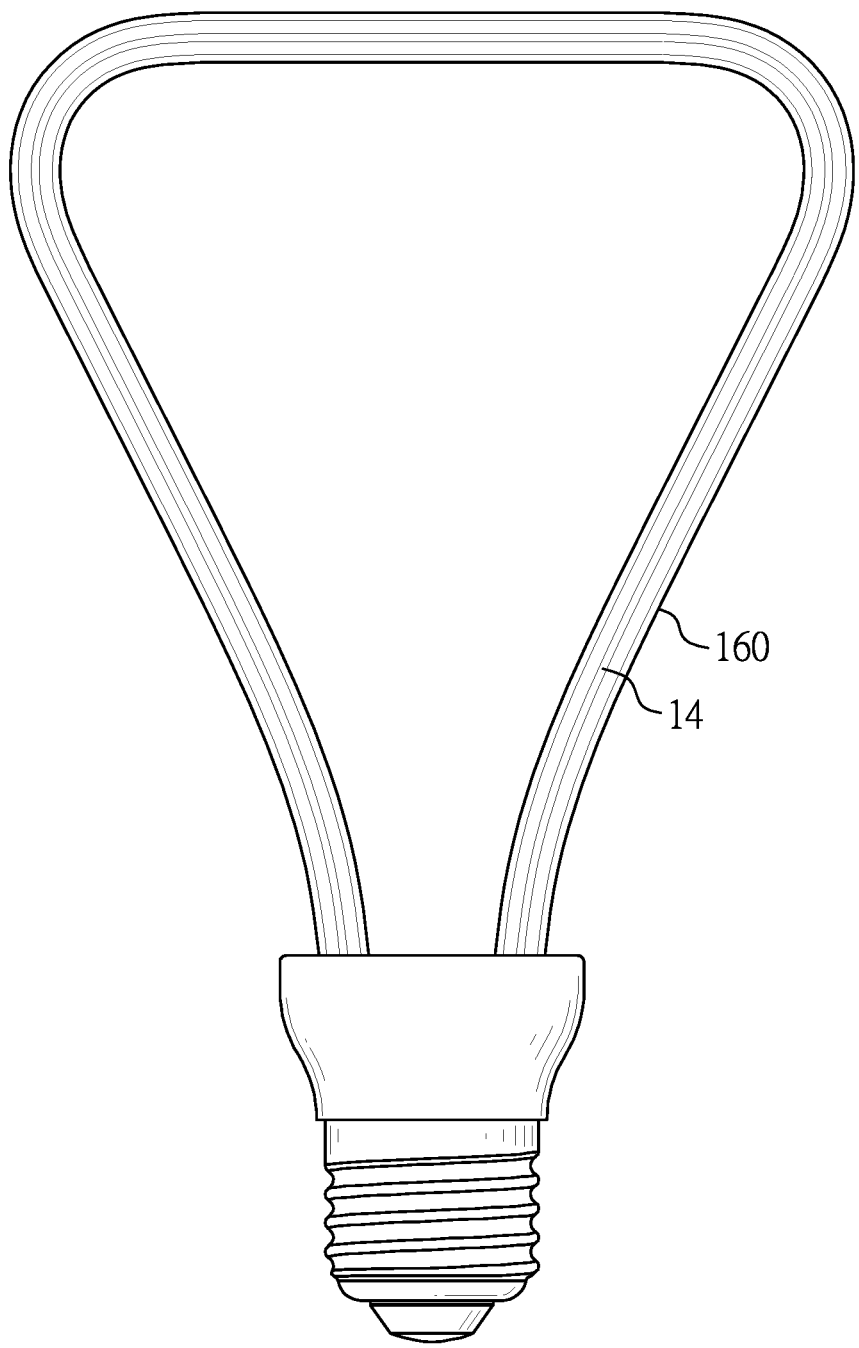
Figure 7G:
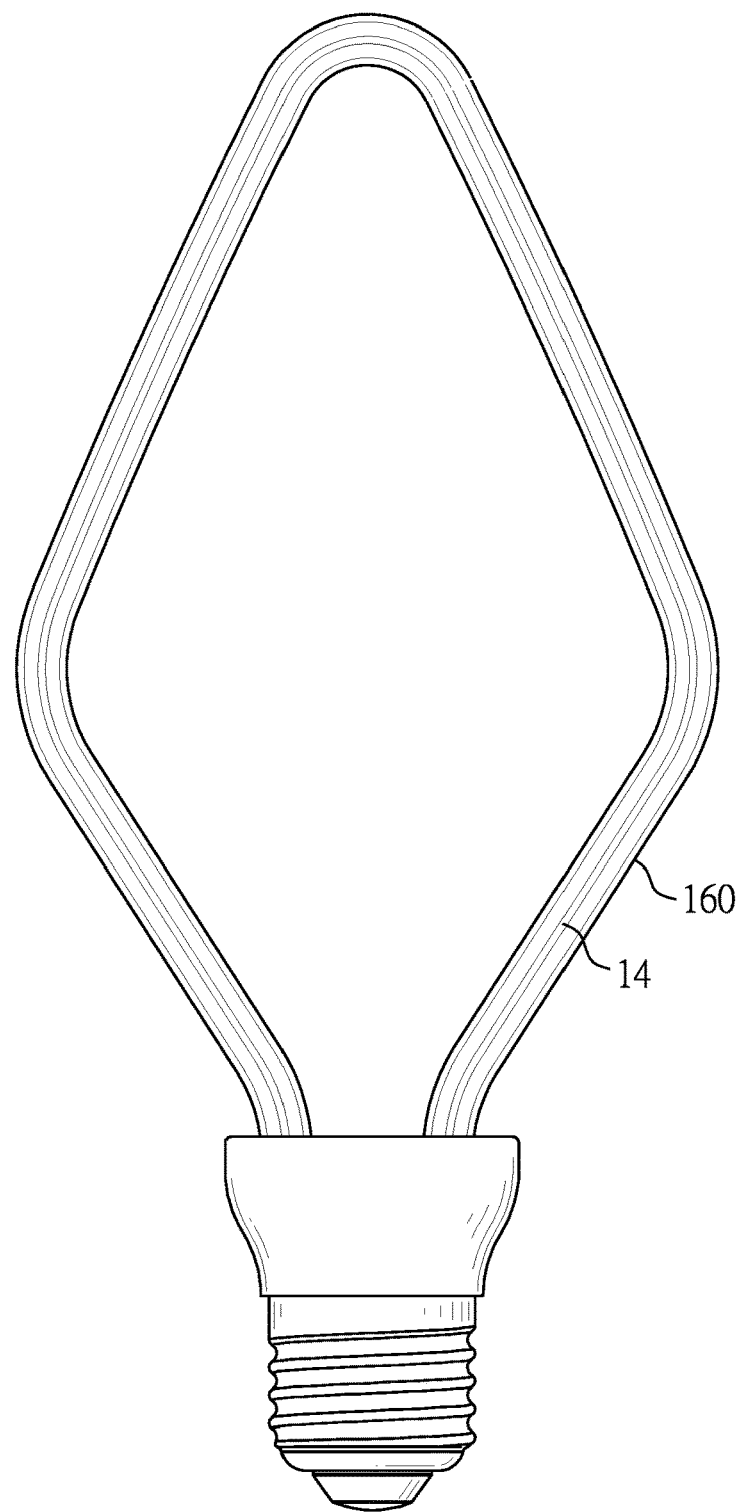
Figure 7H:
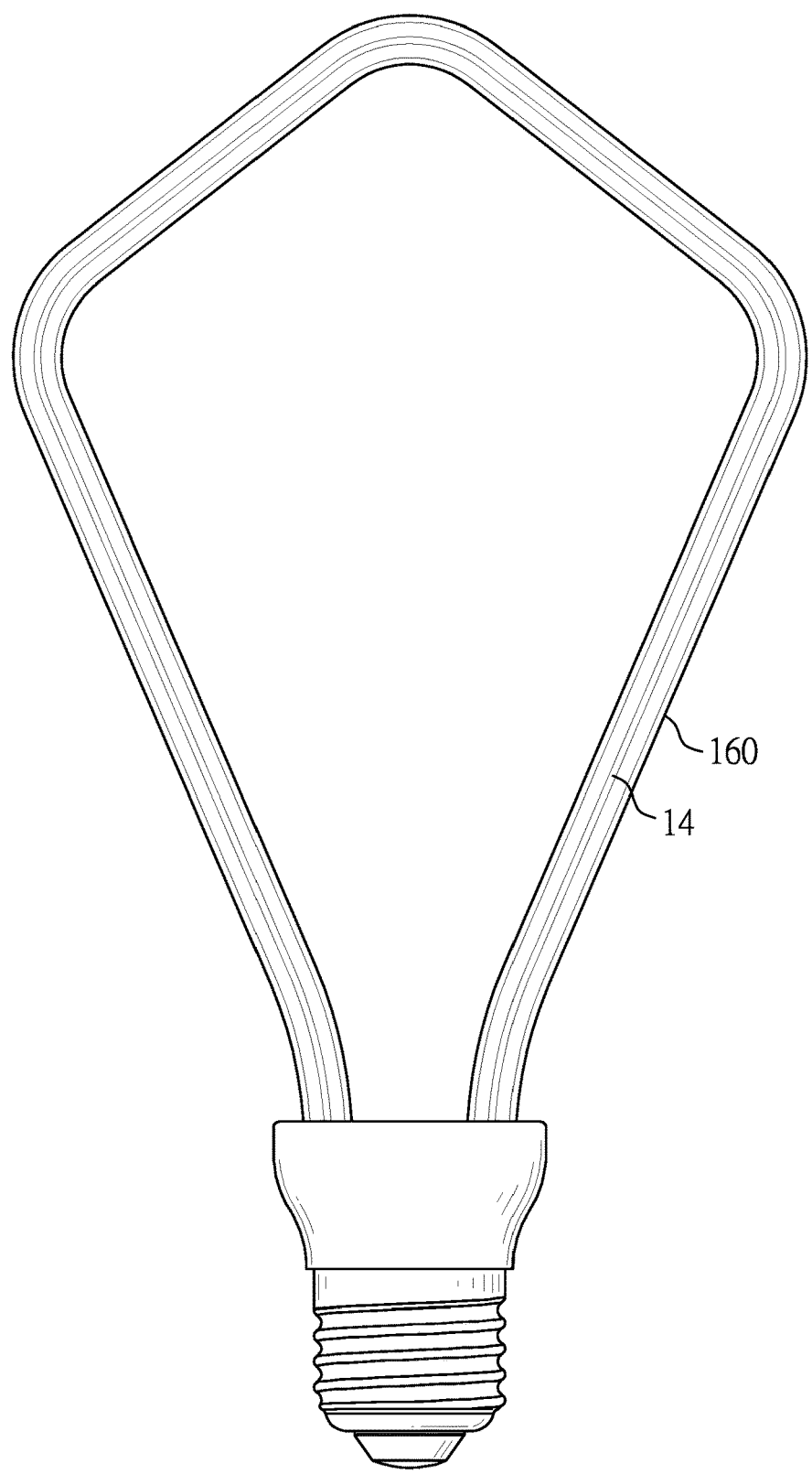
Figure 7I:
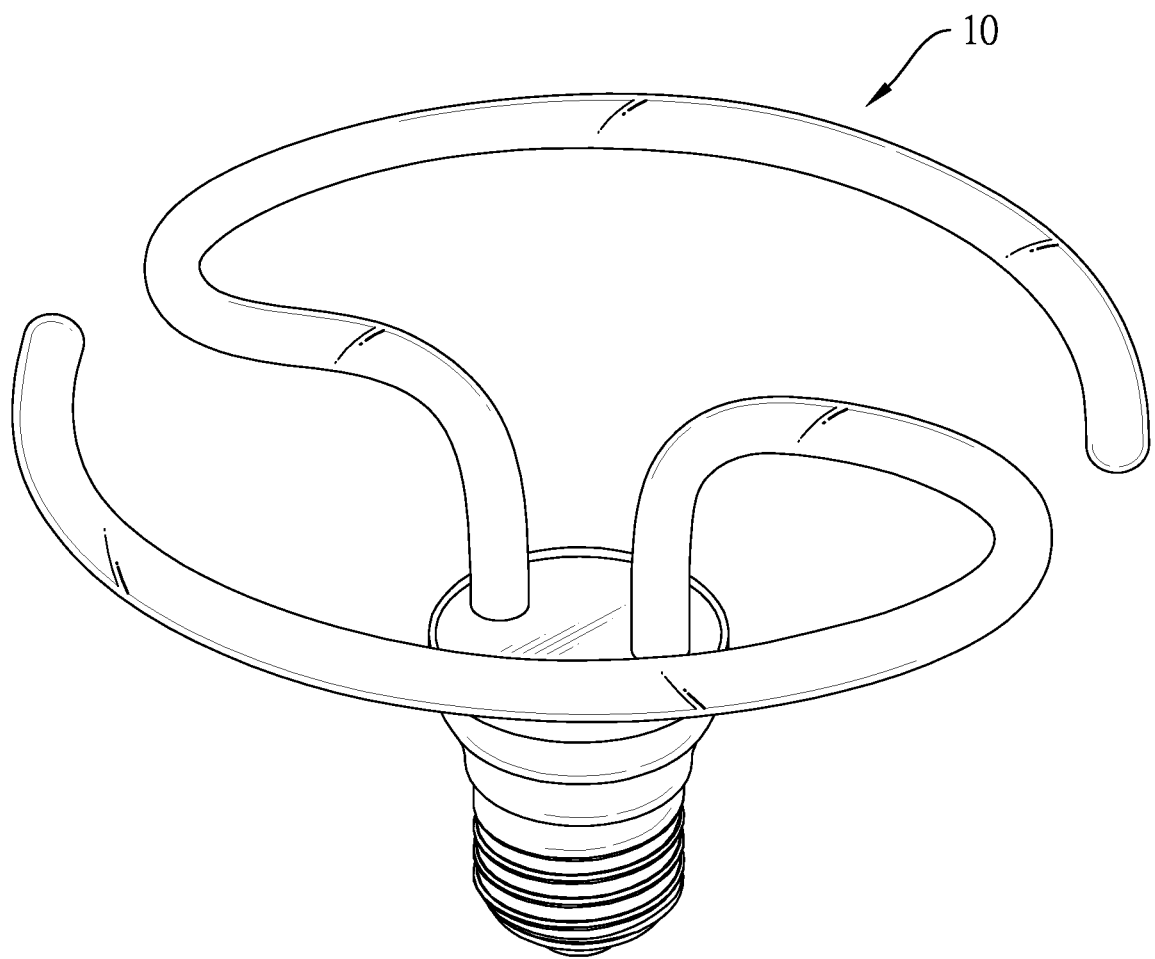

Moreover, as shown in FIGS. 7A~7I, the strip-shaped protective cover 16 can be bent in various ways and is relatively elongated. If there is a significant temperature difference between different sections of the protective cover 16, the heat convection may occur in the cooling liquid 50 inside the protective cover 16. The cooling liquid 50 in the higher temperature section may flow to the lower temperature section. Then, the heat dissipation efficiency can be improved by the heat convection. For example, the LED device 10 shown in FIG. 7A is bent into a circular shape, like a normal bulb. In FIG. 7B, the LED device 10 is bent into a pear shape. In FIG. 7C, the LED device 10 is bent into a heart shape. In FIG. 7D, the LED device 10 is bent into an oval. In FIG. 7E, the LED device 10 is bent into a triangle. In FIG. 7F, the LED device 10 is bent into a trapezoid. In FIG. 7G, the LED device 10 is bent into a diamond shape. In FIG. 7H, the LED device 10 is bent into a sword shape. In FIG. 7I, two LED devices 10 are bent and arranged in the shape of a Tai Chi symbol, and each LED device 10 is singly connected to the circuit board 30. The LED device 10 is bent into several different shapes to provide the user with a variety of modeling options.

Figure 6:
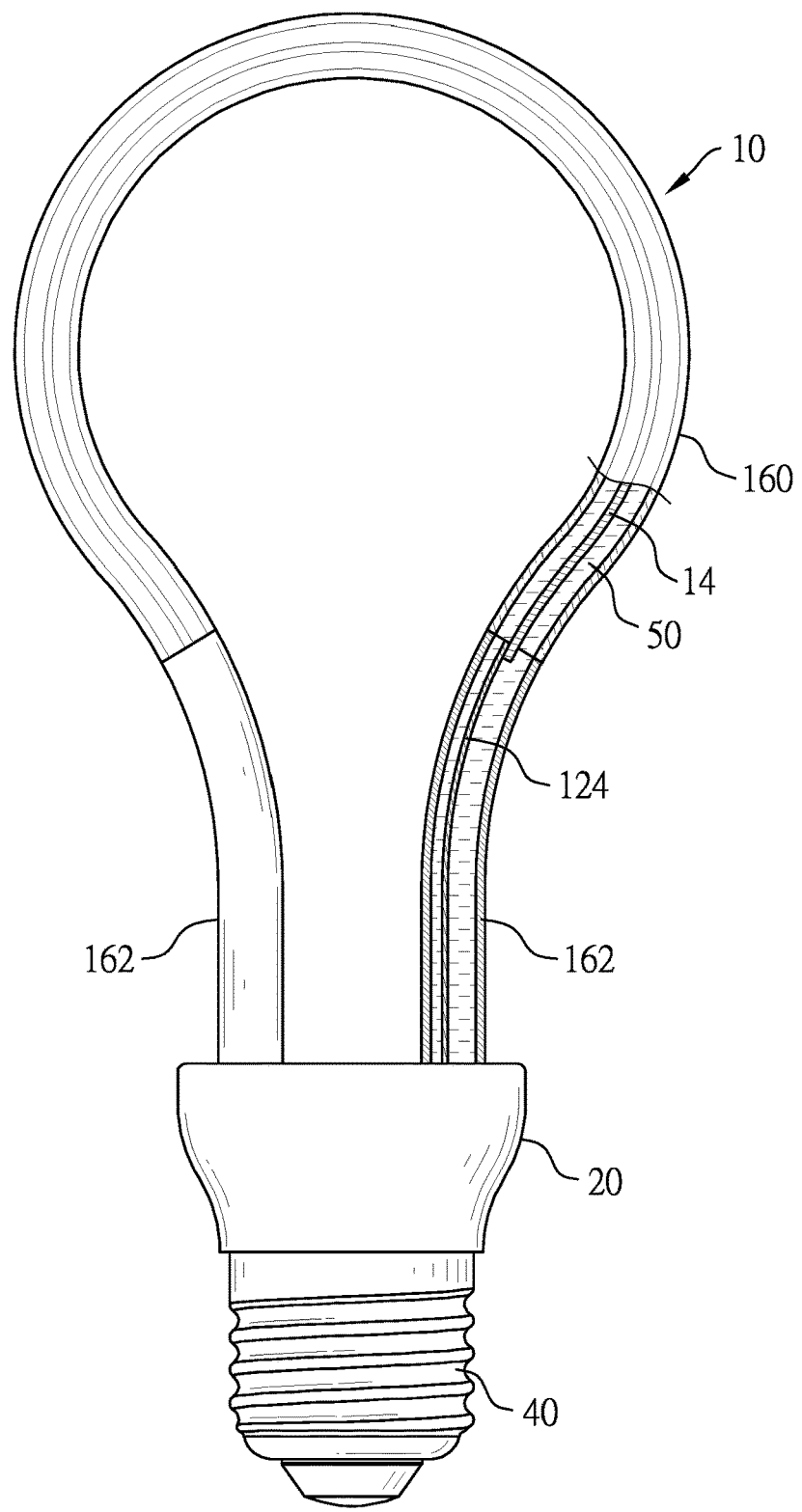
FIG. 6 is a schematic view of the protective cover disposed on the outer side of the light bar in accordance with the present invention.

Referring to FIG. 6, in this embodiment, the protective cover 16 includes a light-transmitting tube 160 and at least one heat-dissipating tube 162. Two heat-dissipating tubes 162 are used as an example herein. The light bar 14 is covered by the light-transmitting tube 160. The material of the heat-dissipating tube 162 may be made of thermally conductive materials, such as metal. The heat-dissipating tubes 162 are also hollow and are respectively connected to two ends of the light-transmitting tube 160. The cooling liquid 50 can flow and transmit heat between the light-transmitting tube 160 and the heat-dissipating tubes 162.

Figure 8A:
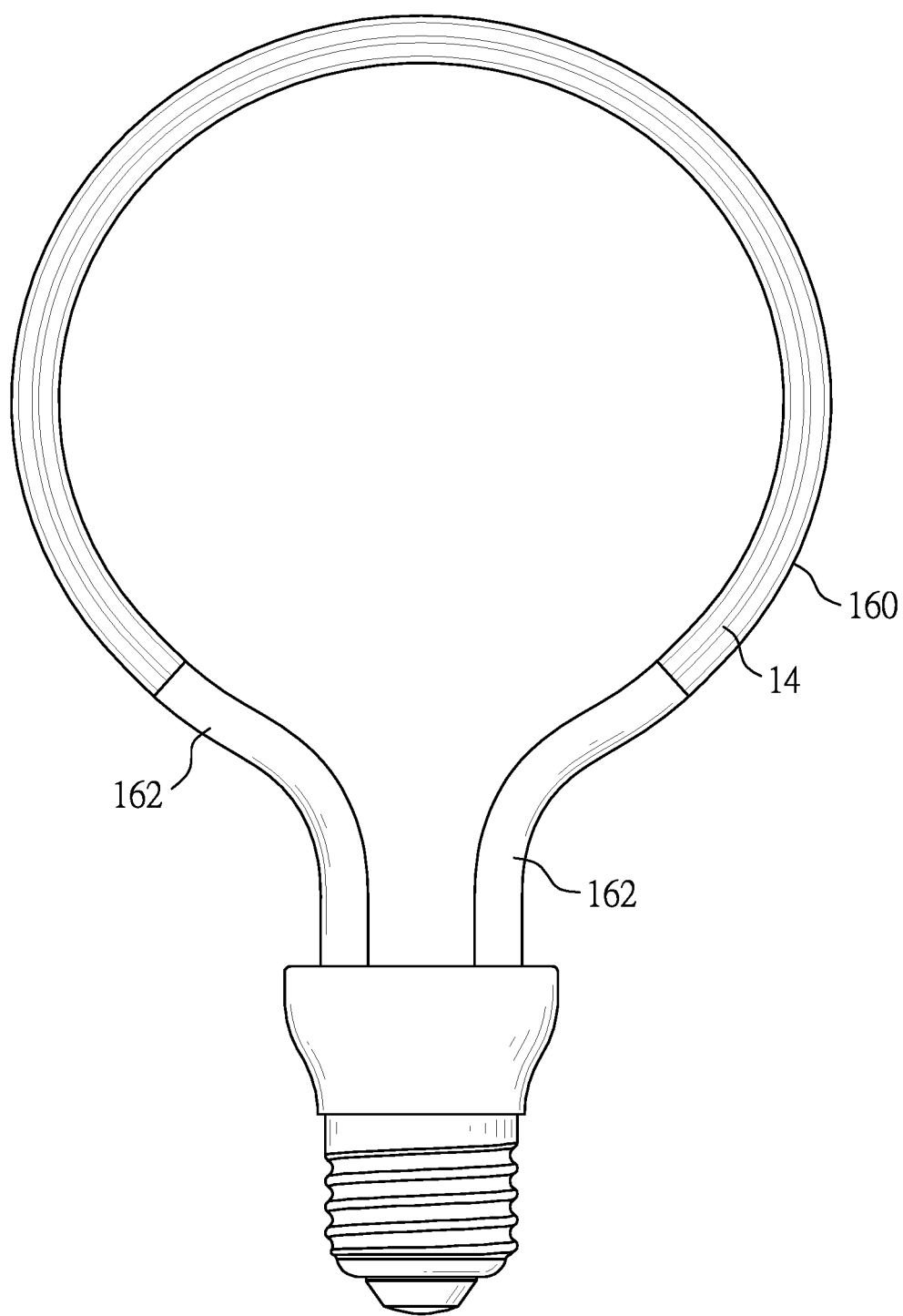
FIGS. 8A~8H are different embodiments of the present invention each provided with a protective cover.
Figure 8B:
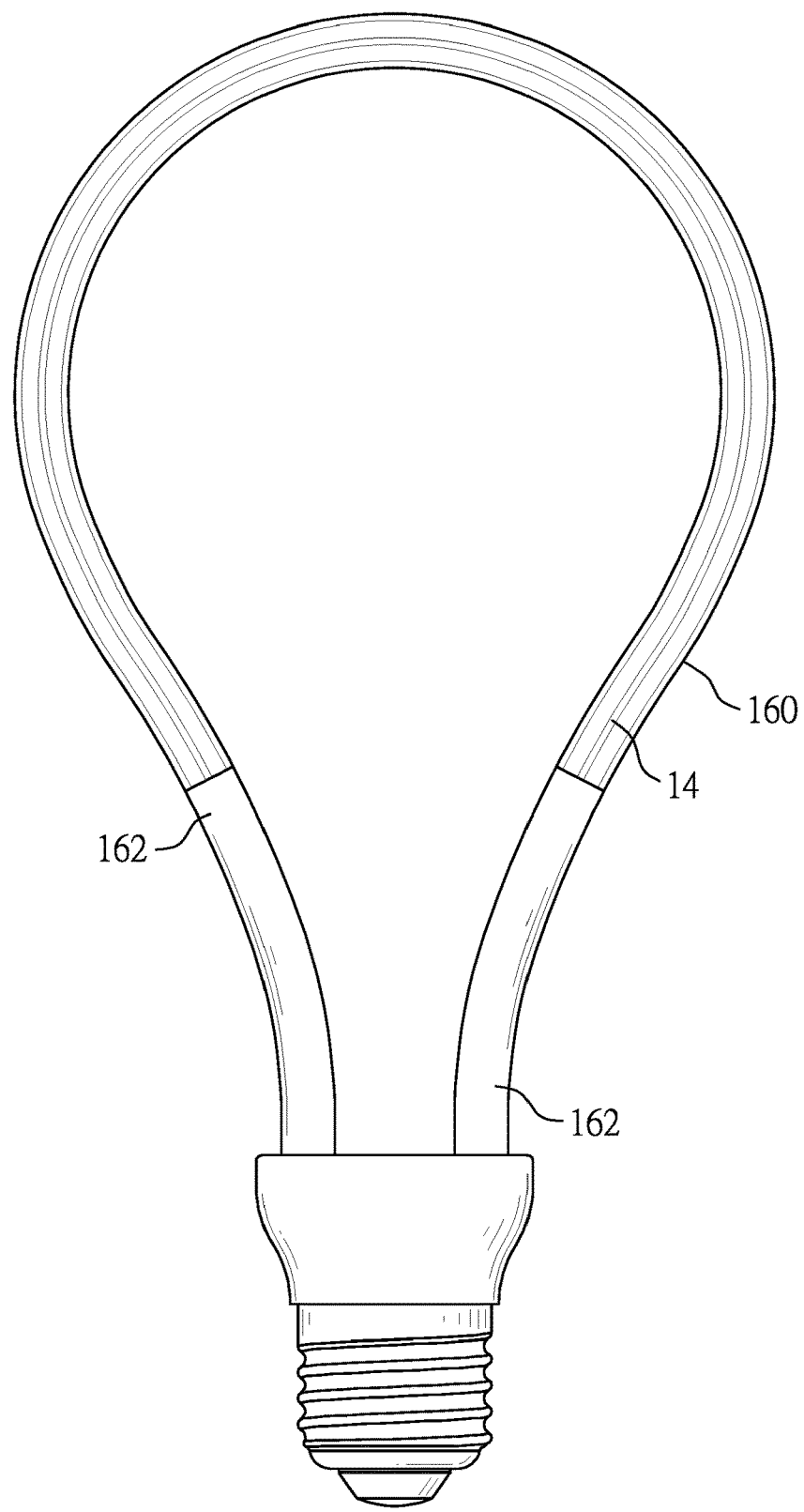
Figure 8C:
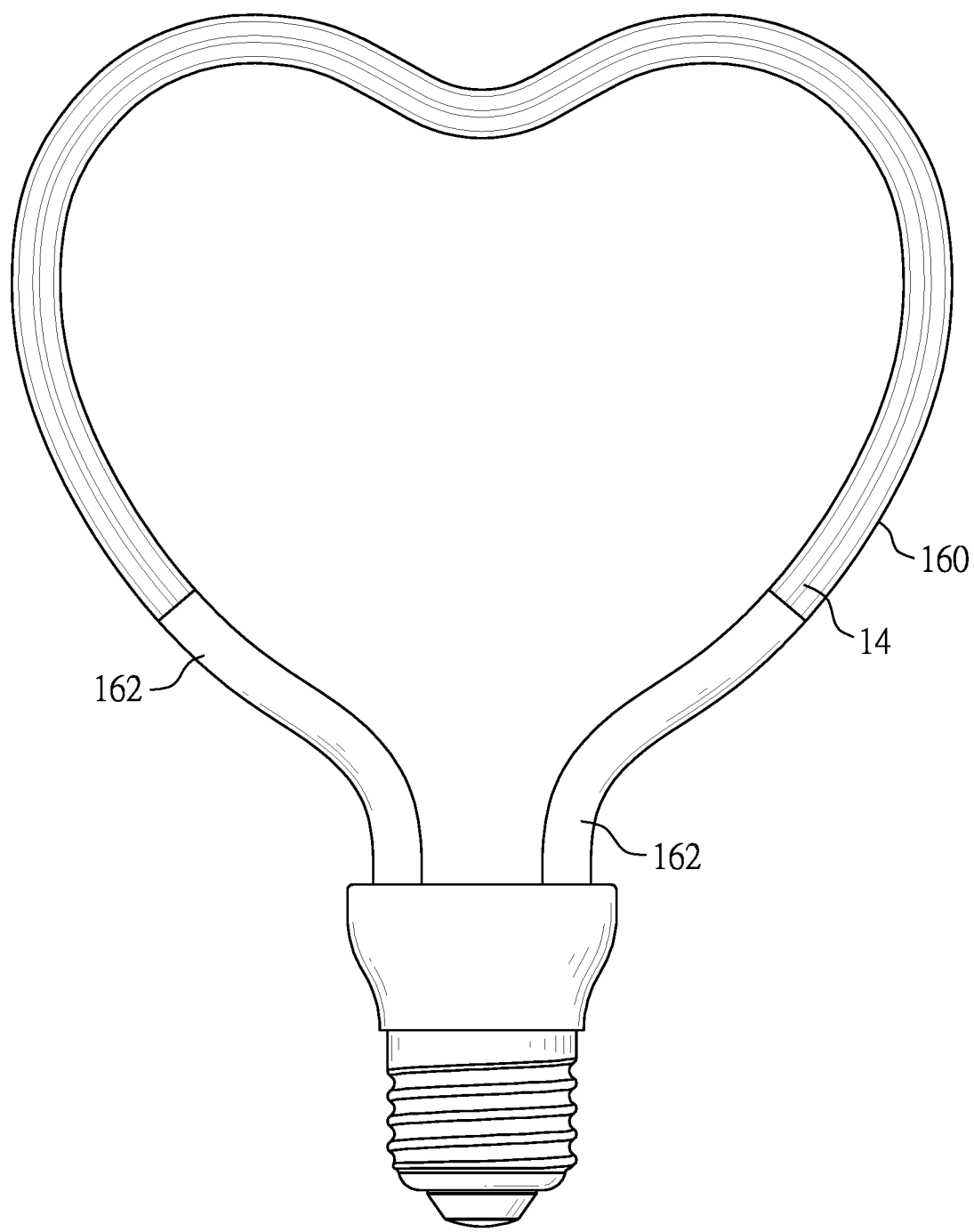
Figure 8D:
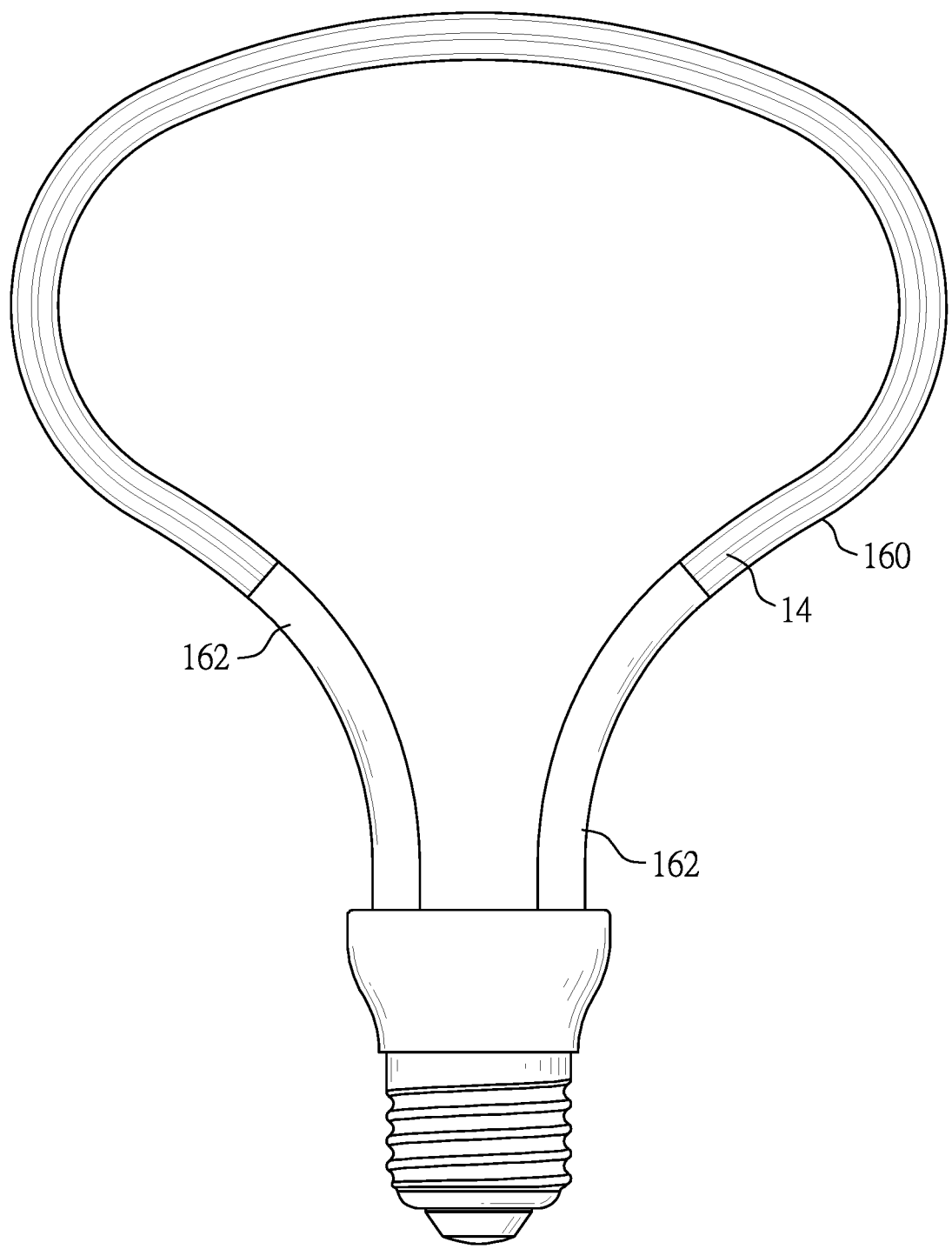
Figure 8E:
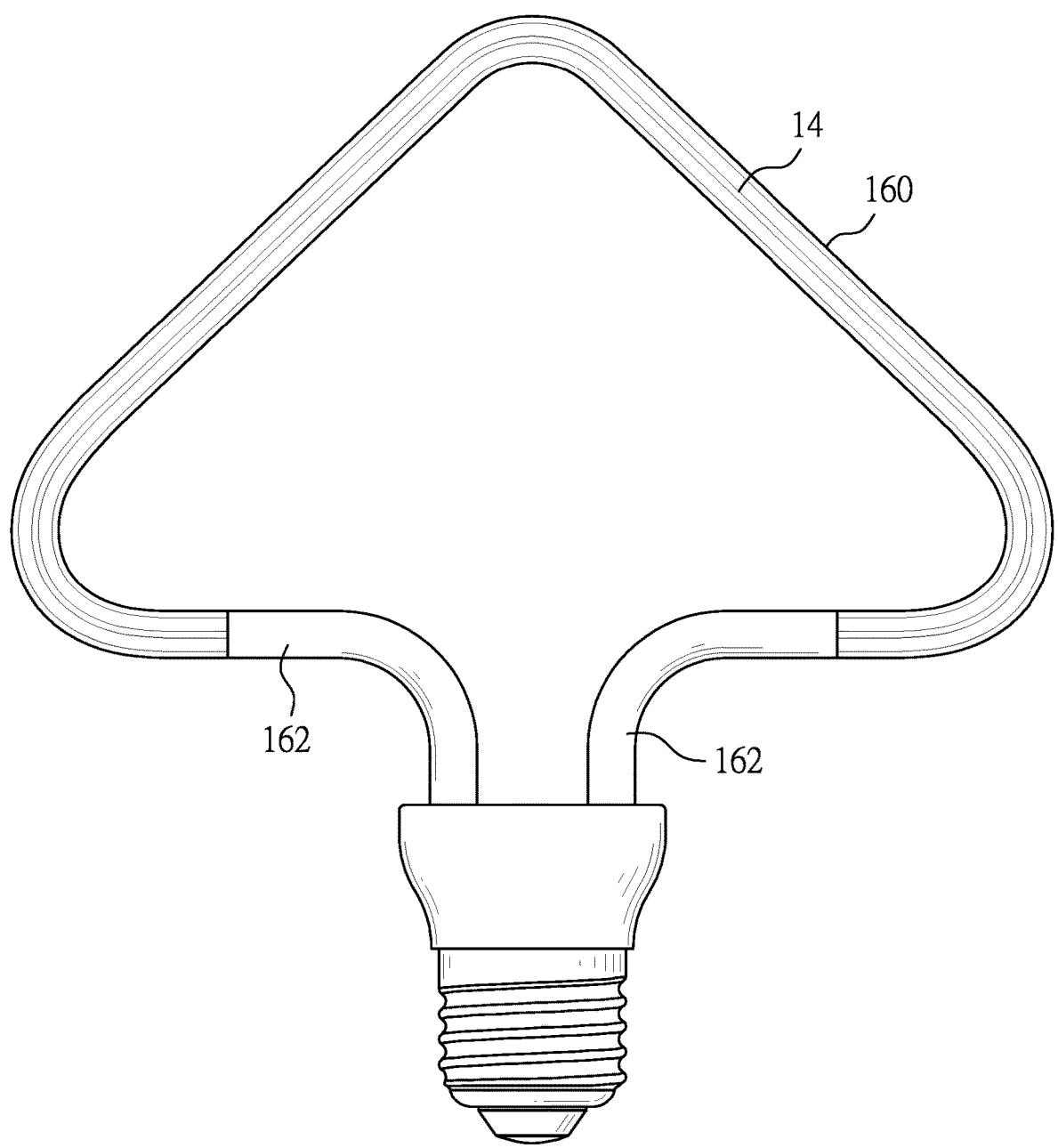
Figure 8F:
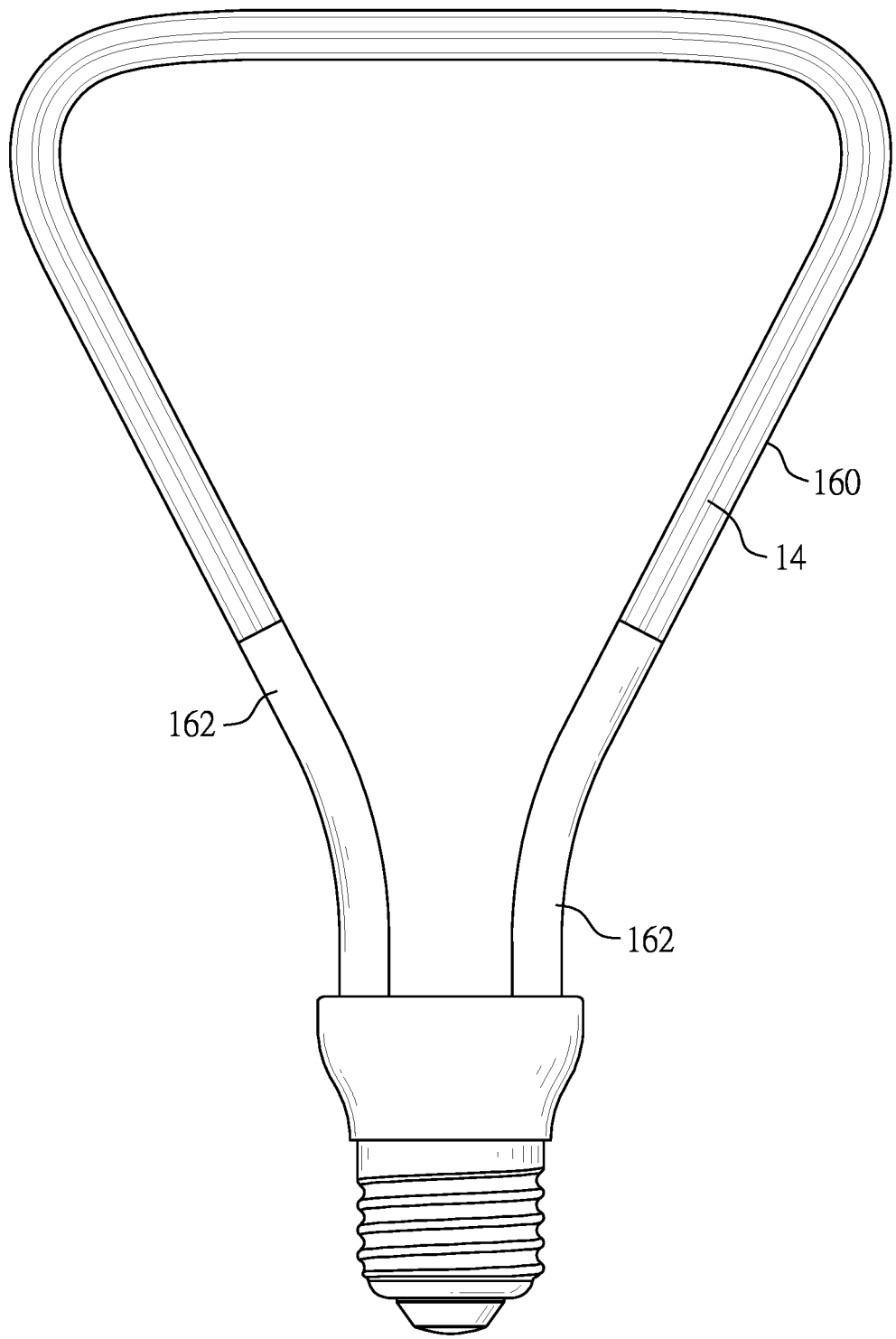
Figure 8G:
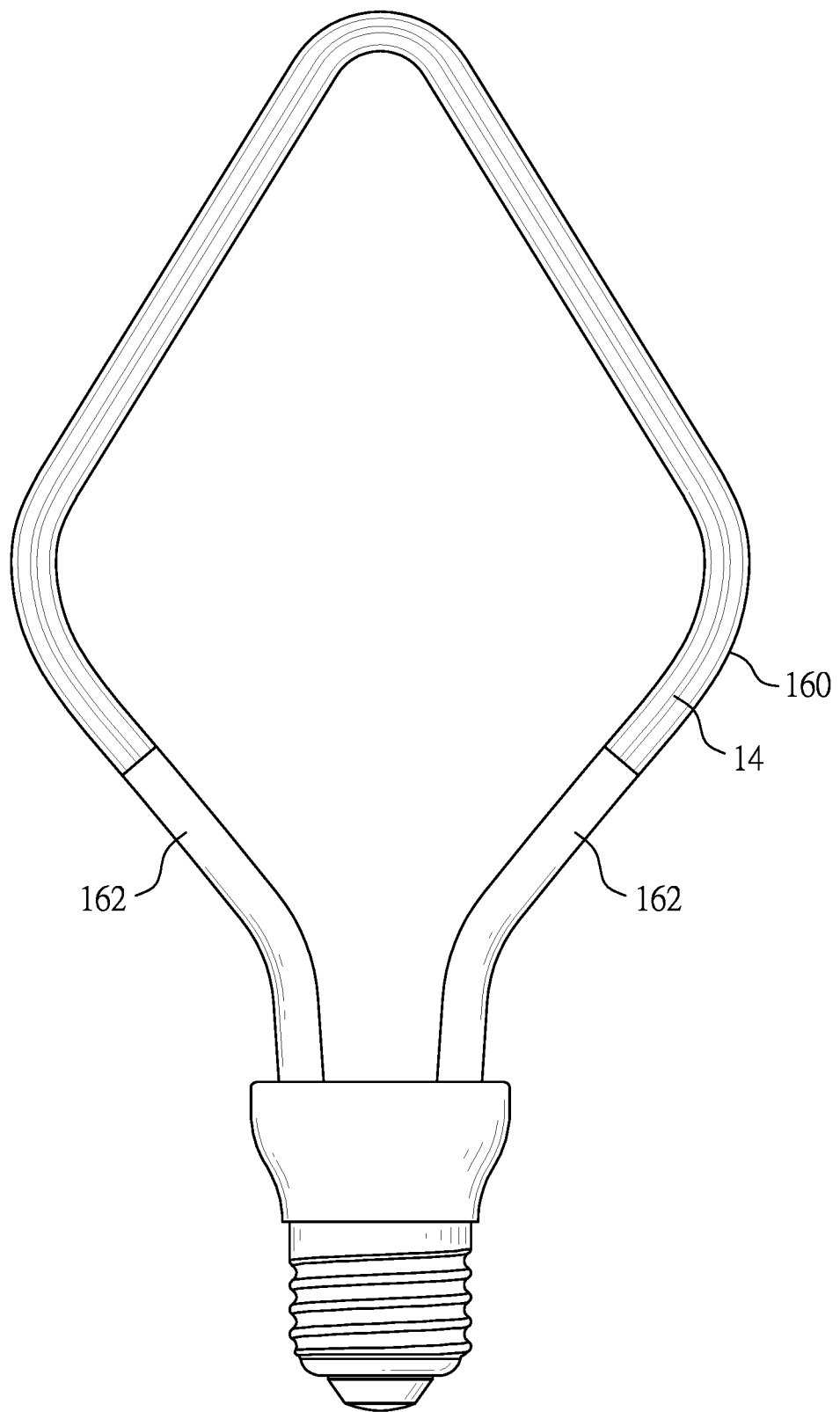
Figure 8H:
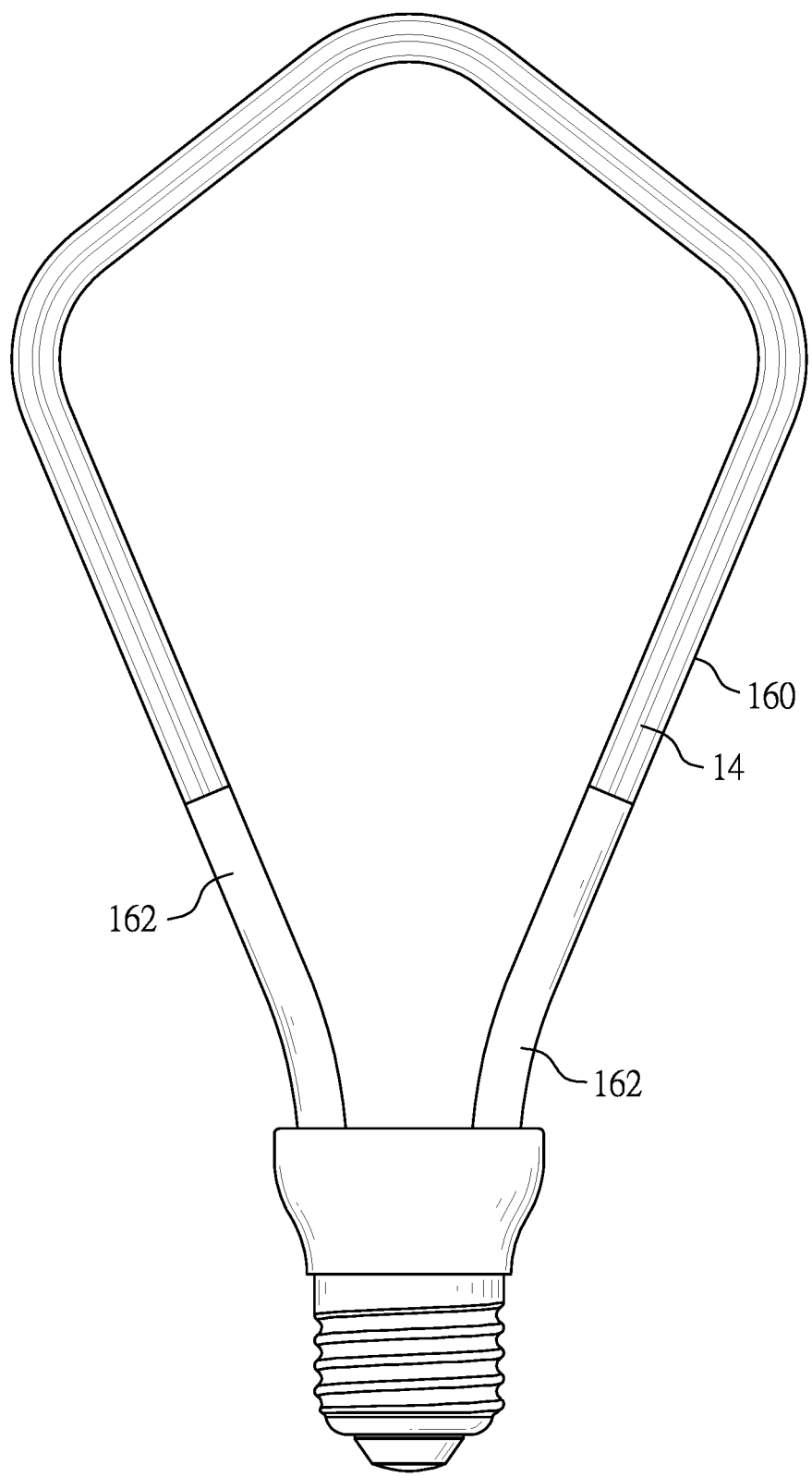

In the embodiment of FIG. 6, since the cooling liquid 50 can directly contact the heat-dissipating tube 162 and the heat-dissipating tube 162 has a higher heat-dissipating efficiency than the light-transmitting tube 160 because of its material, the cooling liquid 50 can further improve the heat dissipation of the lamp. In addition, multiple sections of linear bright and dark areas can be obtained by changing the position of the heat-dissipating tube 162, as shown in FIGS. 8A~8H, which create specific visual effects. For example, the LED device 10 in FIG. 8A is presented in a crescent shape. The LED device 10 is in a half-pear shape as shown in FIG. 8B. The LED device 10 is in a semi-heart shape in FIG. 8C. The LED device 10 has a semi-elliptical shape in FIG. 8D. The LED device 10 is in a semi-triangular shape in FIG. 8E. The LED device 10 is in a semi-trapezoidal shape in FIG. 8F. The LED device 10 is in a semi-rhombus shape in FIG. 8G The LED device 10 is in a semi-sword shape in FIG. 8H.

Even though characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A light emitting diode (LED) lamp with a heat dissipation effect, with the LED lamp comprising:
    a light bar having multiple conductive substrates spaced by intervals and multiple LED chips arranged on the multiple conductive substrates, wherein each LED chip is a double-sided light-emitting flip chip, with each LED chip extending over one of the intervals of two adjacent conductive strips of the multiple conductive substrates and electrically connected by the two adjacent conductive substrates, wherein an upper surface and a lower surface of each of multiple the LED chips are respectively covered with a packaging layer having a maximum width (W2), wherein the light bar has at least one wire connected to the multiple conductive substrates;
    a protective cover comprising an insulative light-transmitting tube having two opposite ends, wherein an outer diameter (D1) of the protective cover is in a range from 4 mm to 16 mm, wherein an inner diameter (D2) of the protective cover is in a range from 3 mm to 15 mm, wherein a ratio of the maximum width (W2) of the packaging layer to the inner diameter (D2) of the protective cover is greater than 0.3 and less than 1, wherein the light-transmitting tube is a plastic tube and covers the light bar;
    cooling liquid being translucent and insulating, wherein the cooling liquid is filled into the protective cover and contacts the light bar;
    sealing elements disposed in the protective cover to prevent the cooling liquid from leaking out, wherein each of the at least one wire of the light bar passes through a respective one of the sealing elements;
    a fixing block, wherein two ends of the light bar covered with the protective cover and filled with the cooling liquid are fixed to the fixing block, wherein a circuit board is disposed inside the fixing block, and wherein the circuit board is electrically connected to the at least one wire of the light bar; and
    a lamp base mounted to the fixing block and electrically connected to the circuit board, wherein the lamp base is adapted to connect an external power source
    wherein a mounting distance (L2) is a maximum distance measured between outer surfaces of two opposite ends of the protective cover along a horizontal direction; and
    wherein an expansion distance (L1) is a maximum distance measured from two symmetrical points on the protective cover along the horizontal direction, wherein the expansion distance (L1) is greater than the mounting distance (L2).

2. The LED lamp as claimed in claim 1, wherein the light bar covered with the protective cover has a shape of a circle, a pear, a heart, an oval, a triangle, a trapezoid, a diamond, a sword or a Tai Chi symbol.

3. The LED lamp as claimed in claim 1, wherein a pigment is added in the cooling liquid.

4. The LED lamp as claimed in claim 1, wherein reflective particles are added in the cooling liquid.

5. The LED lamp as claimed in claim 1, wherein the protective cover further includes at least one heat-dissipating tube, the at least one heat-dissipating tube is hollow, is connected to and communicates with the light-transmitting tube, and the cooling liquid flows in the at least one heat-dissipating tube and the light-transmitting tube.

6. The LED lamp as claimed in claim 5, wherein each of the two heat-dissipating tubes is a metal tube.

7. The LED lamp as claimed in claim 1, wherein the sealing elements are respectively provided at two ends of the light-transmitting tube.

8. The LED lamp as claimed in claim 7, wherein the protective cover further includes at least one heat-dissipating tube, the at least one heat-dissipating tube is hollow, is connected to and communicates with the light-transmitting tube, and the cooling liquid flows in the at least one heat-dissipating tube and the light-transmitting tube.

9. The LED lamp as claimed in claim 8, wherein each of the at least one heat-dissipating tube is a metal tube.

10. The LED lamp as claimed in claim 9, wherein the at least one heat-dissipating tube includes two heat-dissipating tubes which are respectively connected with the two ends of the light-transmitting tube, and wherein the sealing elements are provided at an end of each heat-dissipating tube.

11. The LED lamp as claimed in claim 10, wherein each of the sealing elements is an annular block, a hollow sleeve or a hardened adhesive.

12. A light emitting diode (LED) lamp with a heat dissipation effect, with the LED lamp comprising:
- a light bar having multiple conductive substrates and multiple LED chips arranged on the multiple conductive substrates, wherein each LED chip is a double-sided light emitting flip chip that is hosted and electrically connected by two adjacent said conductive substrates, wherein an upper surface and a lower surface of each of the LED chips are respectively covered with a packaging layer, wherein the light bar has at least one wire connected to the multiple conductive substrates;
- a protective cover comprising an insulative light-transmitting tube, wherein the light-transmitting tube is a plastic tube and covers the light bar, wherein the protective cover further includes two heat-dissipating tubes which are respectively connected with two ends of the light-transmitting tube, wherein the two heat-dissipating tubes are hollow and are connected to and communicate with the light transmitting tube;
- cooling liquid being translucent and insulating, wherein the cooling liquid is filled into the protective cover and contacts the light bar, wherein the cooling liquid flows in the two heat-dissipating tubes and the light-transmitting tube;
- sealing elements disposed in the protective cover to prevent the cooling liquid from leaking out, wherein each of the at least one wire of the light bar passes through a respective one of the sealing elements, and wherein the sealing elements are provided at an end of each heat-dissipating tube;
- a fixing block, wherein an end of the light bar covered with the protective cover and filled with the cooling liquid is fixed to the fixing block, wherein a circuit board is disposed inside the fixing block, and wherein the circuit board is electrically connected to the at least one wire of the light bar; and
- a lamp base mounted to the fixing block and electrically connected to the circuit board, wherein the lamp base is adapted to connect an external power source.

13. The LED lamp as claimed in claim 12, wherein each of the sealing elements is an annular block, a hollow sleeve or a hardened adhesive.

14. The LED lamp as claimed in claim 12, wherein the light bar covered with the protective cover has a shape of a semi-circle, a half-pear, a semi-heart, a semi-oval, a semi-triangle, a semi-trapezoid, a semi-diamond or a semi-sword.

* * * * *